(12) United States Patent
Tsai et al.

(10) Patent No.: US 12,273,116 B2
(45) Date of Patent: *Apr. 8, 2025

(54) PROGRAMMABLE REGULATOR VOLTAGE CONTROLLED RING OSCILLATOR

(71) Applicant: Taiwan Semiconductor Manufacturing Company, Ltd., Hsinchu (TW)

(72) Inventors: Tsung-Hsien Tsai, Taoyuan County (TW); Ruey-Bin Sheen, Taichung (TW); Chih-Hsien Chang, New Taipei (TW); Cheng-Hsiang Hsieh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/366,742

(22) Filed: Aug. 8, 2023

(65) Prior Publication Data

US 2023/0387923 A1 Nov. 30, 2023

Related U.S. Application Data

(63) Continuation of application No. 17/865,464, filed on Jul. 15, 2022, now Pat. No. 11,764,794, which is a continuation of application No. 17/349,991, filed on Jun. 17, 2021, now Pat. No. 11,424,751.

(51) Int. Cl.
*H03L 7/099* (2006.01)
*H03K 3/013* (2006.01)
*H03K 3/03* (2006.01)

(52) U.S. Cl.
CPC .......... *H03L 7/0995* (2013.01); *H03K 3/013* (2013.01); *H03K 3/0322* (2013.01)

(58) Field of Classification Search
CPC ...... H03B 2200/0088; H03B 2200/009; H03K 3/013; H03K 3/0315; H03K 3/0322; H03L 7/0995
USPC ......................................................... 331/57
See application file for complete search history.

(56) References Cited

U.S. PATENT DOCUMENTS

| | | |
|---|---|---|
| 5,434,996 A | 7/1995 | Bell |
| 5,594,392 A | 1/1997 | Kondoh et al. |
| 5,783,956 A | 7/1998 | Ooishi |

(Continued)

*Primary Examiner* — Levi Gannon
(74) *Attorney, Agent, or Firm* — Jones Day

(57) ABSTRACT

Systems, devices, and methods are described herein for aligning a phase of a ring oscillator and removing jitter. An oscillator includes a resistor bank array, an operational amplifier, a first and second transistor, and a realignment circuit. The resistor bank array has a plurality of resistors configured to generate a first signal. The operational amplifier is coupled to a PLL circuit and is configured to compare a voltage of the PLL circuit with a voltage of the resistor bank array. The first transistor is coupled between the operational amplifier and a ring oscillator. The first transistor is configured to generate a second signal to control a frequency of the ring oscillator during a realignment state. The realignment circuit is coupled to the first transistor and the ring oscillator. The realignment circuit is configured to generate a realignment signal to align the ring oscillator with a first clock signal.

20 Claims, 7 Drawing Sheets

(56) References Cited

U.S. PATENT DOCUMENTS

| | | | |
|---|---|---|---|
| 6,104,326 A * | 8/2000 | Lee | H03L 7/0805 |
| | | | 341/68 |
| 6,229,403 B1 | 5/2001 | Sekimoto | |
| 6,617,936 B2 * | 9/2003 | Dally | H03L 7/23 |
| | | | 331/34 |
| 6,650,195 B1 | 11/2003 | Brunn et al. | |
| 9,369,139 B1 * | 6/2016 | Chu | H03L 3/00 |
| 9,525,545 B2 * | 12/2016 | Oh | H04L 7/0331 |
| 10,158,364 B1 * | 12/2018 | Tsai | H03K 3/0315 |
| 10,921,847 B2 | 2/2021 | Jung et al. | |
| 2003/0137357 A1 * | 7/2003 | Ye | H03L 7/0995 |
| | | | 331/57 |
| 2007/0013455 A1 * | 1/2007 | Roubadia | H03L 7/0995 |
| | | | 331/57 |
| 2010/0271140 A1 | 10/2010 | Raghunathan et al. | |
| 2011/0057736 A1 | 3/2011 | Badillo | |
| 2013/0015894 A1 | 1/2013 | Kouyama | |
| 2013/0033331 A1 | 2/2013 | Raghunathan et al. | |
| 2014/0306775 A1 | 10/2014 | Choi et al. | |
| 2016/0087641 A1 | 3/2016 | Familia et al. | |
| 2019/0165769 A1 * | 5/2019 | Tsai | H03L 7/087 |
| 2019/0173425 A1 | 6/2019 | Moon et al. | |
| 2020/0389175 A1 | 12/2020 | Gupta et al. | |

\* cited by examiner

PROGRAMMABLE REGULATOR VOLTAGE CONTROLLED RING OSCILLATOR

CROSS-REFERENCE TO RELATED APPLICATIONS

This application is a continuation application of U.S. patent application Ser. No. 17/865,464, filed Jul. 15, 2022, which is a continuation application of U.S. patent application Ser. No. 17/349,991, filed Jun. 17, 2021, now U.S. Pat. No. 11,424,751, issued Aug. 23, 2022, each of which is incorporated herein by reference in their entirety.

FIELD

The technology described in this disclosure relates generally to realignment techniques for a programmable regulator voltage controlled ring oscillators.

BACKGROUND

Generally, an integrated circuit (IC) is a circuit in which all or some of the circuit elements are inseparably associated and electrically interconnected so that it is considered to be indivisible. An IC is commonly embodied in a wafer. A wafer can be a slice or flat disk of semiconductor material or, for example, of semiconductor material deposited on a substrate, in which circuits or devices are simultaneously processed and, if there is more than one device, subsequently separated into dies. The wafer can have logic circuitry that forms a high-speed digital circuit, such as digital logic for a digital phase locked loop (PLL) circuit, for example. A ring-type voltage controlled oscillator (RO-VCO) is a component of the PLL circuit that facilitates clock generation in a wide range of application-specific integrated circuits (ASICs) including, but not limited to, network controllers, I/O controllers, graphics processors, or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
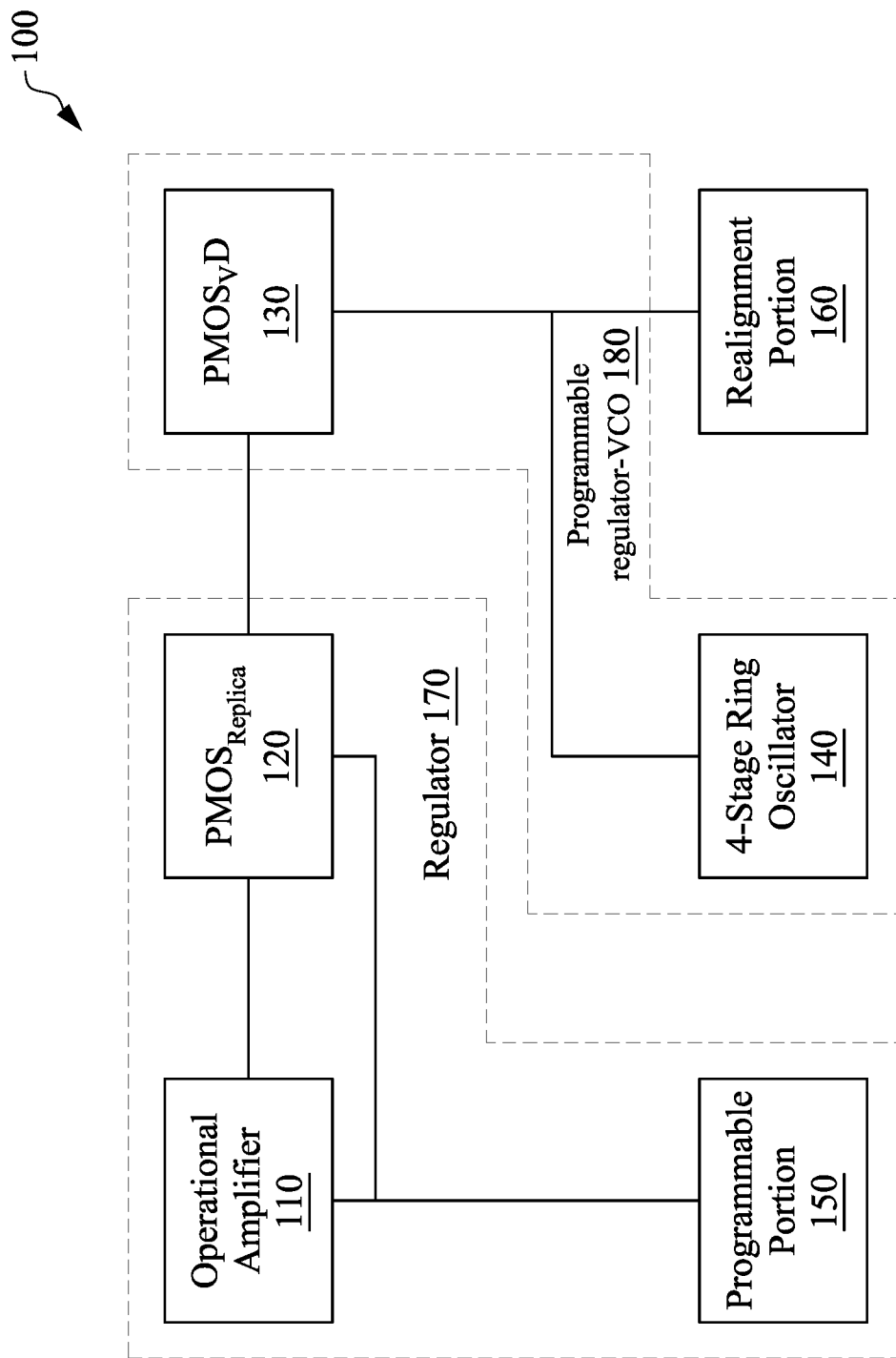
FIG. 1 is a block diagram of a programmable regulator voltage controlled ring oscillator in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

A phase-locked loop (PLL) is an electrical circuit that generates an output signal having a phase that is related to an input signal. PLLs are used in a number of different applications such as radio, telecommunications, and other electronic applications that process a signal containing noise. For example, PLLs can be used to generate, stabilize, demodulate, filter, or recover a signal after it has passed through a noisy communications channel. A ring-type voltage controlled oscillator (RO-VCO) is a component of the PLL circuit that facilitates clock generation in a wide range of application-specific integrated circuits (ASICs) including, but not limited to, network controllers, I/O controllers, graphics processors, or the like. RO-VCOs, however, may experience jitter performance degradation caused by high gains and/or phase noise. Realignment techniques, such as those described in U.S. Pat. No. 10,516,385 entitled "Ring Oscillator, Controlling Circuit and Methods for Realignment" and U.S. Pat. No. 10,461,723, entitled "Full Range Realignment Ring Oscillator," the contents of which are incorporated herein by reference, can suppress the in-band noise of an RO-VCO. The present disclosure relates to a current-type realignment using a programmable solution that facilitates adjustment of the strength of realignment for the balance of phase noise and/or cycle-to-cycle jitter.

FIG. 1 is a block diagram of a programmable regulator voltage controlled ring oscillator (REG-VCO) 100 in accordance with various embodiments of the present disclosure. The REG-VCO 100 includes an operational amplifier 110, two PMOS devices (e.g., $PMOS_{REPLICA}$ 120 and $PMOS_{VD}$ 130), a four stage RO 140, a programmable portion 150, and a realignment portion 160. The operational amplifier 110, $PMOS_{REPLICA}$ 120, and programmable portion 150 form a regulator 170. Through modification of the programmable portion 150 the strength and/or pulse width can be tuned, as described in more detail in FIGS. 2-3. The realigned strength is controlled by the amount of current through the four stage RO 140. The regulator 170 is coupled to a programmable regulator VCO 180 which includes a $PMOS_{VD}$ 130 and four stage RO 140. The programmable regulator VCO 180 couples to the realignment portion 160. The realignment portion 160 resets the accumulated jitter of four stage RO 140 by aligning a phase of a waveform of the four state RO 140 with a clock signal generated by the realignment portion 160.

Figure 2:
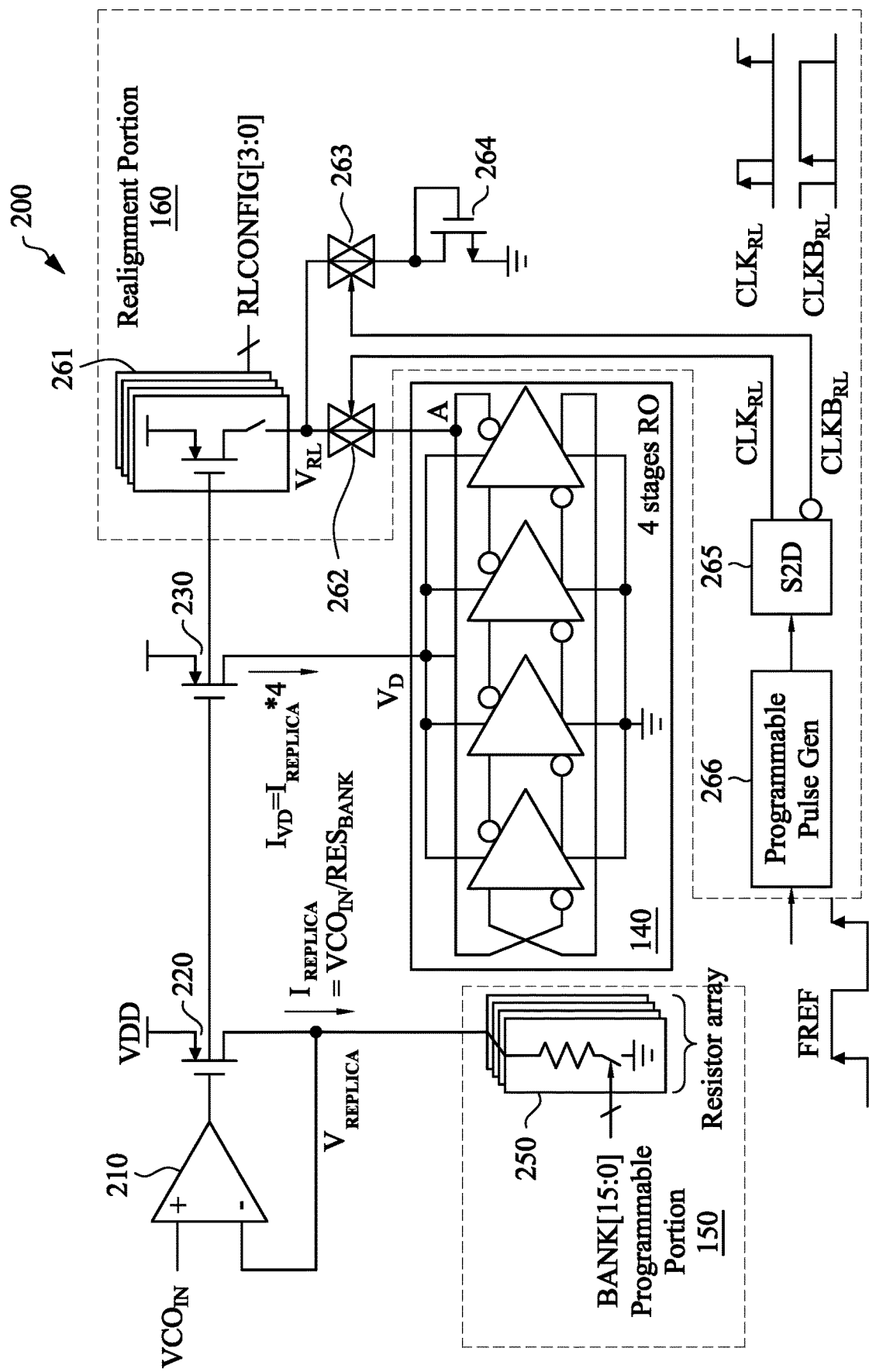
FIG. 2 is a schematic of a programmable regulator voltage controlled ring oscillator in accordance with various embodiments of the present disclosure.

FIG. 2 is a schematic of a programmable regulator voltage controlled ring oscillator (REG-VCO) 200 in accordance with various embodiments of the present disclosure. REG-VCO 200 includes an operational amplifier 210, two PMOS devices (e.g., $PMOS_{REPLICA}$ 220 and $PMOS_{VD}$ 230), a four stage RO 240, a programmable portion 250, and a realignment portion 260.

In one embodiment, the programmable portion 160 is resistor bank array 250. Resistor bank array 250 can have any number of resistors and switches. In one embodiment, resistor bank array 250 has approximately sixteen (16) resistors, each of which are coupled to a switch. The controlling bits (e.g., tuning words), called BANK[15:0] in FIG. 2, connect to the digital-top of PLL (not shown) such as a hybrid-type PLL and/or an analog PLL. The resistance of the resistor bank array, 250, can be expressed as a function of a total unit resistance, $RES_{UNIT}$, and the number of banks tuned on, BANK:

$$RES_{ARRAY} = \frac{RES_{UNIT}}{BANK}. \quad (1)$$

A pulse-terminal (e.g., non-inverting terminal) of operational amplifier 210 is coupled to an voltage controlled oscillator input voltage (e.g., $VCO_{IN}$), which is connected to a low-pass-filter of a PLL (not shown). In some embodiments, the voltage of $VCO_{IN}$ can vary between 0.3V and 0.6 V. An inverting terminal of operational amplifier 210 is coupled to a drain terminal of $PMOS_{REPLICA}$ 220 and resistor bank array 250. A voltage, $V_{REPLICA}$, is measured at the connection point of the inverting input of operational amplifier 210, a drain terminal of $PMOS_{REPLICA}$ 220, and the resistor bank array 250. The gate terminals of $PMOS_{REPLICA}$ 220 and $PMOS_{VD}$ 230 each connect to the output terminal of operational amplifier 210. The drain-terminal of $PMOS_{VD}$ 230 couples to the supply of the four stage differential ring oscillator 140 and generates a voltage, $V_D$. Both the realignment portion 160 and the four stage differential ring oscillator 140 are coupled to $PMOS_{VD}$ 230.

The operation current of $PMOS_{REPLICA}$ 220 is $I_{REPLICA}$. The operation current of $PMOS_{VD}$ 230 is $I_{VD}$. The device size of $PMOS_{VD}$ 230 is approximately four (4) times of $PMOS_{REPLICA}$ 220. As a result, the amount of current of $I_{VD}$ is approximately four (4) times of $I_{REPLICA}$ as represented by the following expression:

$$I_{VD} = I_{REPLICA} * 4. \quad (2)$$

The equivalent resistance of resistor bank array 250 is adjusted by using resistors in parallel to generate an equivalent resistance $RES_{BANK}$. $I_{REPLICA}$ is generated by the $V_{REPLICA}$ divided by equivalent resistance of resistor bank array 250, RES ARRAY as represented by the following expression:

$$I_{REPLICA} = \frac{V_{REPLICA}}{RES_{ARRAY}}. \quad (3)$$

Due to the nature of the electrical combination of operational amplifier 210 and $PMOS_{REPLICA}$ 220, $V_{REPLICA}$ follows $VCO_{IN}$. Therefore, $I_{REPLICA}$ can also be expressed as $$I_{REPLICA} = \frac{VCO_{IN}}{RES_{ARRAY}}. \quad (4)$$

The operational current of $PMOS_{VD}$, $I_{VD}$, follows $VCO_{IN}$ as well, which results in the following expression:

$$I_{VD} = \frac{VCO_{IN}}{RES_{ARRAY}} * 4. \quad (6)$$

When the voltage controlled oscillator voltage, $VCO_{IN}$, is a fixed voltage, the operational current of $PMOS_{VD}$, $I_{VD}$, can be adjusted by different tuning words. The operational current of $PMOS_{VD}$, $I_{VD}$, controls the four stage RO 140 to generate an oscillating clock and the operation frequency is $F_{VCO}$. In other words, $F_{VCO}$ varies with $I_{VD}$. The frequency of RO, $F_{VCO}$, varies with the tuning words. However, the $F_{VCO}$ adjusted by tuning words is discrete (e.g., not continuous) and the discrete frequency tuning range, in some embodiments, can spread from 4 GHz to 16 GHz. Such tuning is known as discrete frequency tuning that can be used in hybrid-PLL, such as described in U.S. Pat. No. 10,164,649, entitled "Hybrid Phase Lock Loop," U.S. Pat. No. 10,523,221, entitled "Hybrid Phase Lock Loop," and U.S. Pat. No. 10,749,537, entitled "Hybrid Phase Lock Loop," each of which are incorporated herein by reference in their entirety. The discrete frequency tuning range can spread from 4 GHz to 16 GHz.

The realignment portion 160 includes realigned current cell array 261 (e.g., PMOS devices with switches), at least two transmission-gates (TG) (e.g., TG 262 and TG 263), a NMOS with diode connection 264, programmable pulse generator 266, and a signal-to-differential circuit (S2D) 265. The device size of realigned current cell array 261 is approximately one-fourth (¼) of $PMOS_{VD}$ 260 in order to pull up the oscillating signal at node A. In some embodiments, the realigned current cell array 261 includes four (4) current cells with switches. The current through realigned current cell array 261 can be represented by the following:

$$I_{RL\_CELL} = \frac{1}{4} * I_{VD}. \quad (7)$$

The diode-connection NMOS 264 provides a standby current for the realigned current cell array 261. The diode-connection NMOS 264 can ensure the realigned signal can be fast switched to TG 262 from TG 263. During realignment, a reference frequency, FREF, such as a high quality clock, induces the phase of a waveform of the four stage ring oscillator 140 to clean the accumulated jitter. The programmable pulse generator 266 converts the high quality clock to a narrow pulse clock and through S2D circuit 265 to generate realignment clock signals, $CLK_{RL}$ and $CLKB_{RL}$. The pulse width is controlled to less than half period of four stage RO 140. When realignment is not occurring, the clock signals, $CLK_{RL}$ and $CLKB_{RL}$, disable TG 262 and enable TG 263 to maintain the realigned signal on diode-connect NMOS 264. When the rising edge of high quality clock arrives at the programmable pulse generator 266 and subsequently to S2D 265, the clock signals, $CLK_{RL}$ and $CLKB_{RL}$, go high from low and low from high, respectively, to turn on TG 262 and turn off TG 263. The realigned signal goes through TG 262 to inject into four stage RO 140 and pulling high oscillating waveform. The phase of a waveform of the four stage RO 140 is realigned by the high quality clock to clean the accumulating jitter of four stage RO 140 for improving in-band noise. The voltage of the four stages RO 140, $V_D$, can be represented by the following expression:

$$V_D = \frac{VCO_{IN}}{RES_{ARRAY}} * 4 * RES_{RO}, \quad (5)$$

where $RES_{RO}$ is the resistance of four stage RO 140.

Figure 3:
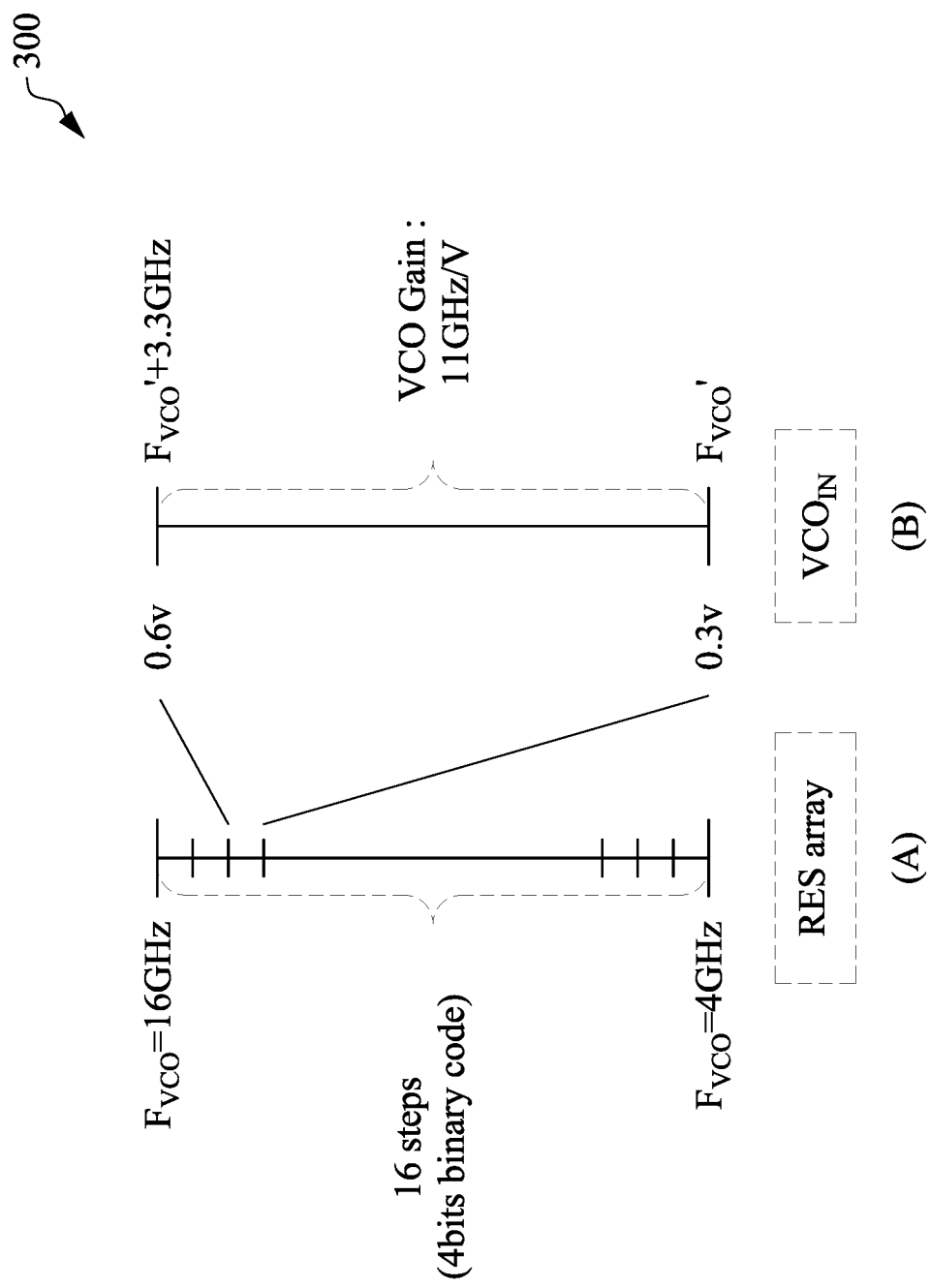
FIG. 3 is a graphical representation of the tuning range of the programmable regulator voltage controlled ring oscillators in accordance with various embodiments of the present disclosure.

FIG. 3 is a graphical representation of the tuning range of the programmable regulator voltage controlled ring oscillators in accordance with various embodiments of the present disclosure. The graphic plot (A) illustrates a discrete frequency tuning range of a programmable regulator voltage controlled ring oscillator. In one embodiment, the array block has 16 resistors, a unit resistance, $RES_{UNIT}$, is approximately 1 kΩ, and 4 banks are turned on. In this embodiment, the resistance of the resistor bank array 250, $RES_{ARRAY}$, as defined by Equation (1) is approximately 25052. The discrete frequency tuning range in plot (A) spreads from 4 GHz to 16 GHz with tuning words (BANK [15:0]) of 0 to 15, which can be separated into 16 steps that correspond to the voltage, $V_D$. In other words, the resistor bank array 250 becomes a voltage, DAC, that controls $V_D$. When the resistor bank array 250 fixes at a code, the $V_{REPLICA}$ follows the $VCO_{IN}$ and $V_D$ proportionally and increases or decreases with $V_{REPLICA}$ due to the ratio of $I_{REPLICA}$ and $I_{VD}$. However, when the BANK[15:0] is at fixed digits, the continuous frequency range is 3.3 GHz with 0.3V voltage range of $VCO_{IN}$ (0.3V to 0.6V). This in turn means that the gain of VCO (KVCO) is approximately 11 GHz/V as illustrated in graphic plot (B). However, the frequency range of 4 GHz to 16 GHz is tuned by $VCO_{IN}$ of 0.3V to 0.6V and its KVCO is 40 GHz/V. Hence, the KVCO is reduced by approximately 3.6 times.

Figure 4:
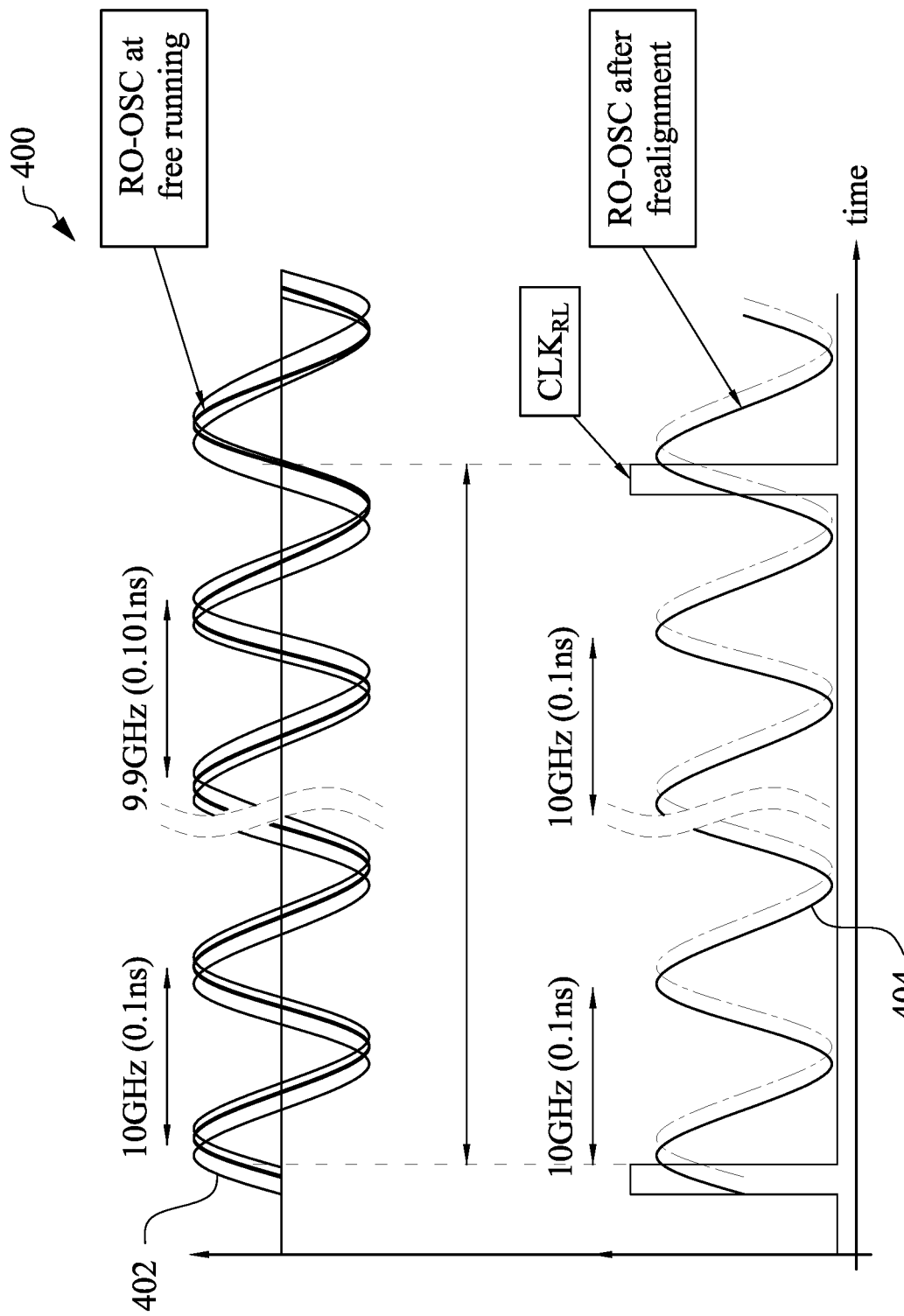
FIG. 4 depicts a timing diagram showing clock jitter of an example four stage ring oscillator in accordance with various embodiments of the present disclosure.

FIG. 4 depicts a timing diagram showing clock jitter of an example four stage RO 140 in accordance with various embodiments of the present disclosure. As depicted in the upper waveform 402 of FIG. 3, the four stage RO 140 may exhibit frequency drifting at free running due to the intrinsic accumulated noise. Thus, for instance, the four stage RO 140 may originally have a resonant frequency of 10.0 GHz and a period of 0.1 ns, but frequency drifting causes the resonant frequency to drift to 9.9 GHz with a period of 0.101 ns. This frequency drifting can be due, in part, to intrinsic device noise. However, the intrinsic device noise can get worse as process technology evolves. The noise is accumulated in four stage RO 140 and degrades the phase noise and clock jitter.

As depicted in the lower waveform 404 of FIG. 4 and as previously described in FIG. 2, the $CLKB_{RL}$ disables TG 263 and $CLK_{RL}$ enables TG 262 to shunt the realigned signal of the array from the diode-connect NMOS 264 to four stage RO 140. The oscillating net of four stage RO 140 is pulled up and the voltage of $V_{RL}$ goes high and the oscillating phase of a waveform of the four stage RO 140 is aligned by $CLK_{RL}$, which comes from external high quality clock to have low jitter and low phase noise. When the oscillating net of four stage RO 140 is aligned by reference frequency, FREF, such as a high quality clock, its accumulated jitter is cleaned, and its phase noise and clock jitter all have improved. Hence, the output clock of four stage RO 140 can be maintained at 10 GHz shown in the lower waveform 404 of FIG. 4.

Figure 5:
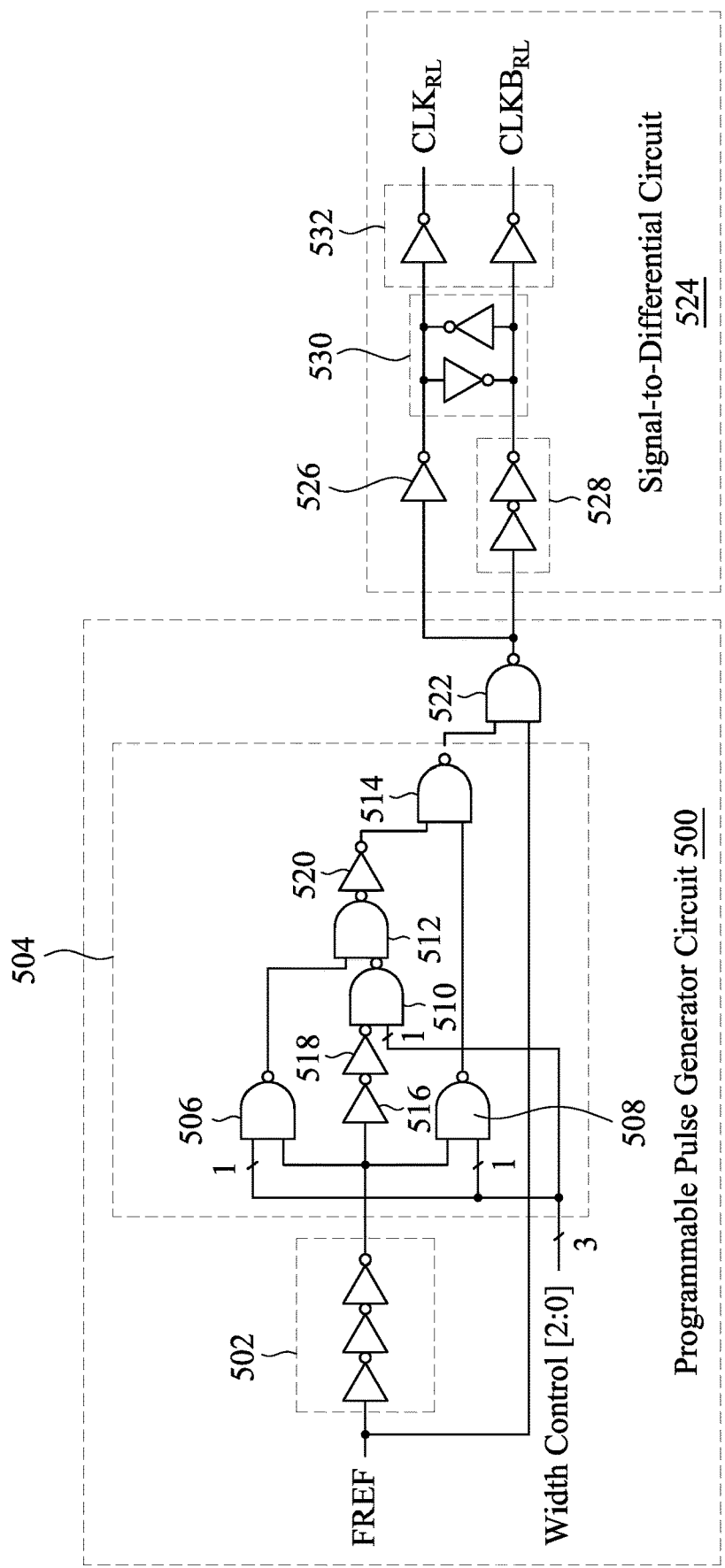
FIG. 5 is a schematic diagram of a pulse generator and signal-to-differential circuit in accordance with various embodiments of the present disclosure.

FIG. 5 is a schematic diagram of a pulse generator 500 and signal-to-differential circuit 524 in accordance with various embodiments of the present disclosure. The combination of the programmable pulse generator 500 and the signal-to-differential circuit 524 may be used, for instance, as part of the realignment portion 160 shown in FIG. 2 for generating the realignment clock signals $CLKB_{RL}$, $CLK_{RL}$. The programmable pulse generator 500 converts high quality clock signals to a narrow pulse clock with various pulse width (e.g., 3 different pulse widths) and then the maximum pulse width is smaller than approximately half (½) of the oscillating period. The pulse width can be based on system application. The S2D circuit 524 converts single-end clock signals to differential clock signals so as to control TGs (e.g., TG 262, 263) of realignment portion 160.

In the pulse generator 500 of FIG. 5, a reference clock FREF is received by an inverter train 502, which operates to delay and invert the reference clock FREF. In some embodiments, the reference clock FREF is a high-quality clock signal with low phase noise, and the pulse generator 500 processes the high-quality clock signal to generate the realignment signals RLB, RL having relatively narrow pulses that are repeated periodically. In some embodiments, the pulses of the realignment signals RLB, RL have widths that are less than one half of the period of the oscillator (e.g., the four stage RO 140). The delayed and inverted version of the reference clock signal FREF is received by a width control circuit 504 that includes NAND gates 506, 508, 510, 512, 514 and inverters 516, 518, 520 electrically coupled together as shown in FIG. 5. The width control circuit 504 also receives a three-bit width control signal [2:0] and uses this received signal to control the width of the pulses generated by the pulse generator 500.

As seen in the example embodiment of FIG. 5, a first bit of the three-bit width control signal [2:0] is received at the NAND gate 506, a second bit of the three-bit width control signal [2:0] is received at the NAND gate 508, and a third bit of the three-bit width control signal [2:0] is received at the NAND gate 510. The table below illustrates an example scheme by which the three-bit width control signal [2:0] may be used to control the width of the pulses generated by the pulse generator 500:

| Width control[2.0] | Pulse width |
| --- | --- |
| 3'b001 | Level0 (narrow) |
| 3'b010 | Level1 (middle) |
| 3'b100 | Level2 (wide) |

As seen in the table above, in this example, if the first bit (e.g., least-significant bit) is high (e.g., logic-level high or "1"), and the second and third bits are low (e.g., logic-level low or "0"), then the pulse signal generated by the pulse generator 500 has a first width (e.g., a narrowest width). Further, in this example, if the third bit (e.g., most-significant bit) is high, and the first and second bits are low, then the pulse signal generated by the pulse generator 500 has a second width (e.g., a widest width). Additionally, in this example, if the second bit is high, and the first and third bits are low, then the pulse signal generated by the pulse generator 500 has a third width (e.g., a medium width that is between the aforementioned narrowest and widest widths).

The output of the width control circuit 504 is received by the NAND gate 522, which also receives the FREF reference clock signal. The NAND gate 522 processes the two inputs to generate a single-ended output signal that is received by a single-to-differential circuit 524.

Figure 6:
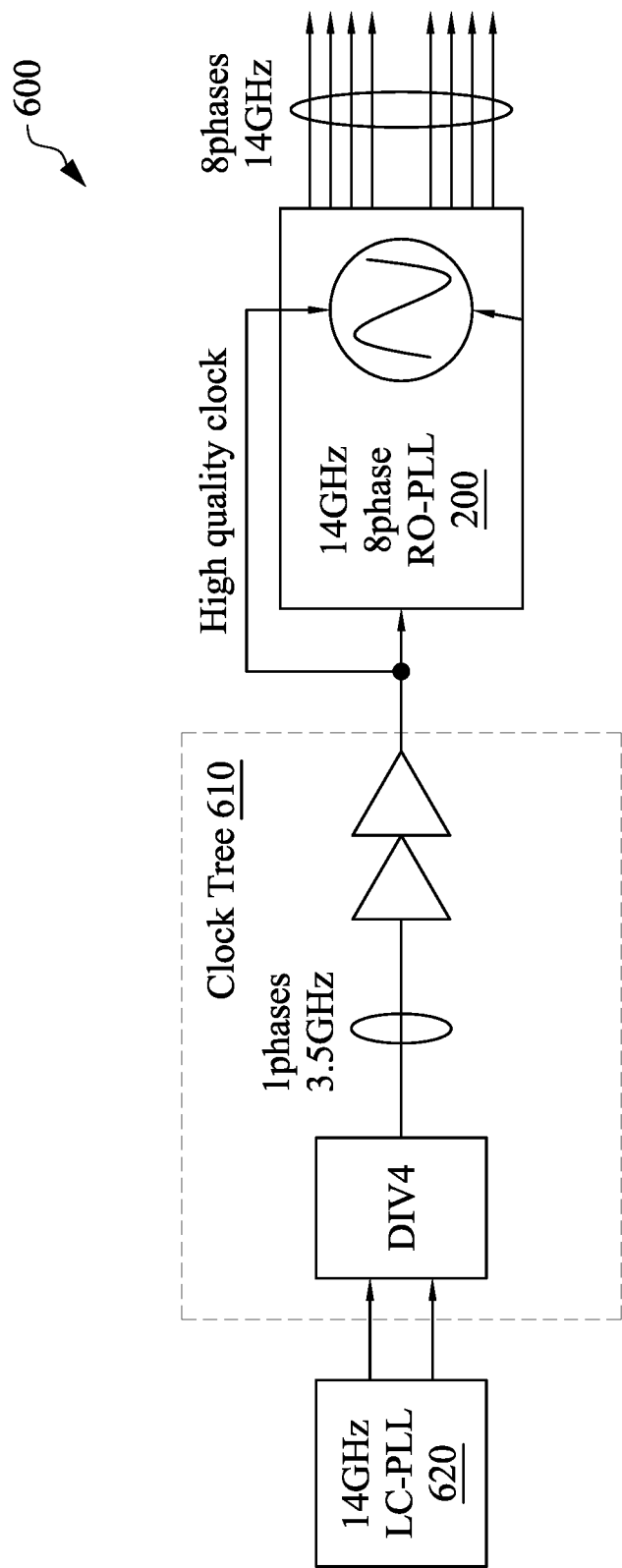
FIG. 6 is a block diagram illustrating an example system using the programmable regulator voltage ring oscillator in accordance with various embodiments of the present disclosure.

FIG. 6 is a block diagram illustrating an example system 600 using the programmable regulator voltage ring oscillator 200 in accordance with various embodiments of the present disclosure. In some embodiments, system 600 is a multi-phase realignment ring oscillator type PLL (RO-PLL) that incorporates the programmable regulator voltage ring oscillator 200. The multi-phase RO-PLL 600 also includes a inductance-capacitance PLL (LC-PLL) 620 and clock tree 610. The four stage RO 140 can provide 8 phase outputs (e.g., 14 GHz) assemble higher speed clock for 112 Gbps or 224 Gbps applications.

Use of the various circuits and methods as described herein can provide a number of advantages. For example, use of the subject matter enables improving the in-band noise of a RO of at least 33 dB at 10 MHz offset. The RO-VCO described herein can meet the jitter requirement of a SerDes system (e.g., 112 Gbps or higher data-rate). The RO-VCO can also replace traditional combination of poly-phase filter and proportional-integrator (PI) as well because RO-VCO can directly provide multi-phase clock output. With the embodiments described herein, the gain of VCO (KVCO) can be reduced by up to 70% and the in-band noise of VCO can be improved by at least 33 dB at a 10 MHz offset.

Figure 7:
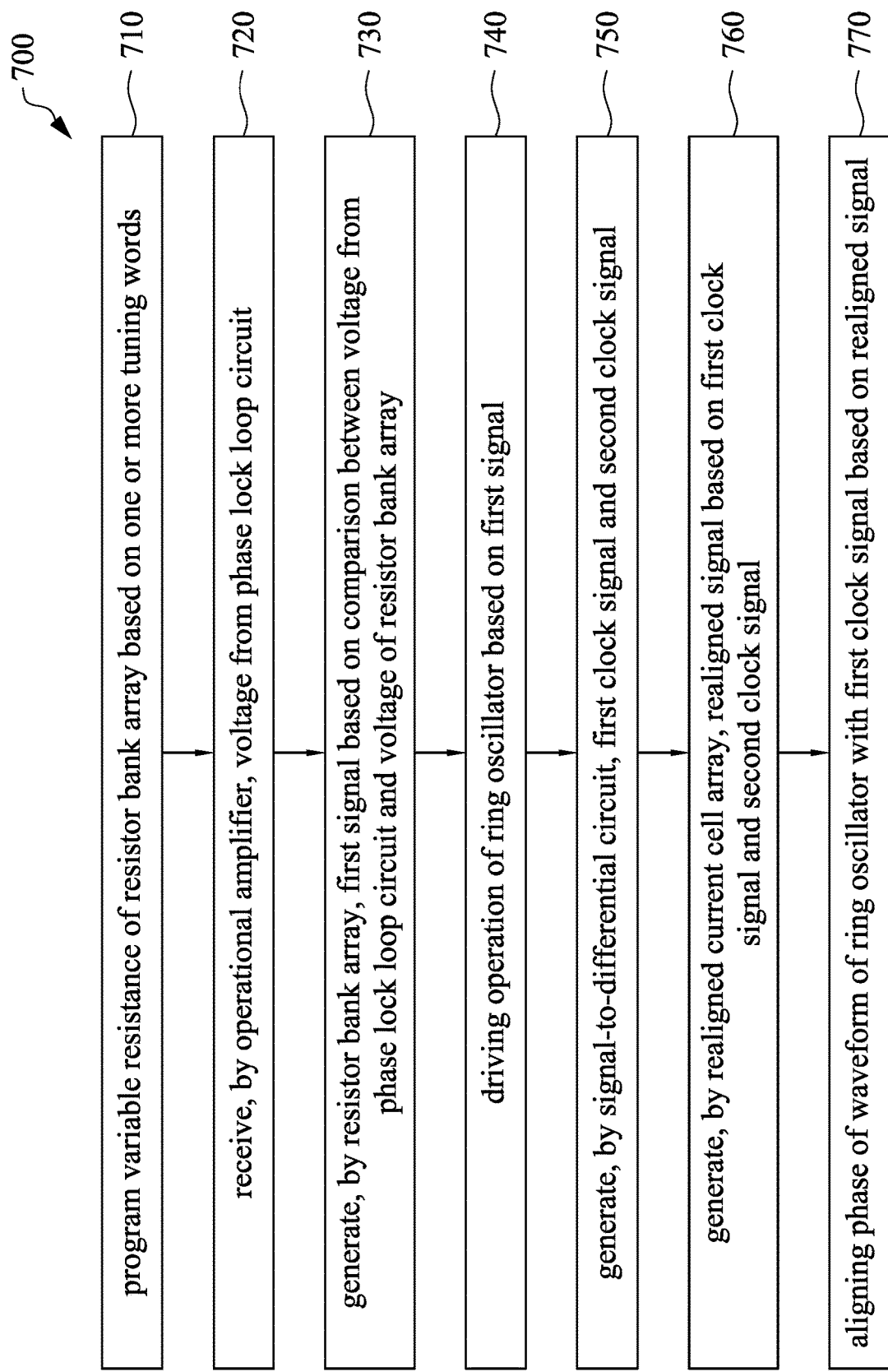
FIG. 7 is an exemplary flow chart illustrating a method of realigning a programmable regulator voltage ring oscillator in accordance with various embodiments of the present disclosure.

FIG. 7 is an exemplary flow chart 700 illustrating a method of realigning a programmable regulator voltage ring oscillator in accordance with various embodiments of the present disclosure. While FIG. 7 is described here with reference to previously described structures for ease in understanding, it is understood that the method applies to many other structures as well. A variable resistance, RES$_{ARRAY}$, of a resistor bank array 250 is programmed, at step 710, based on one or more tuning words (e.g., BANK [15:0]). An operational amplifier 210 receives, at step 720, a voltage, VCO$_{IN}$, from a PLL circuit such as LC-PLL 620 of FIG. 6. The resistor bank array 250 generates, at step 730, a first signal (e.g., I$_{REPLICA}$) based on a comparison between the voltage from the PLL circuit (e.g., VCO$_{IN}$) and a voltage of the resistor bank array (e.g., V$_{REPLICA}$) Operation of a ring oscillator such as four stage RO 140 is controlled, at step 740, based on the first signal (e.g., I$_{REPLICA}$). A signal-to-differential circuit 265 generates, at step 750, a first clock signal (e.g., CLK$_{RL}$) and a second clock signal (e.g., CLKB$_{RL}$). A realigned current cell array 261 generates, at step 760, a realigned signal (e.g., current through realigned current cell array 261) based on the first clock signal (e.g., CLK$_{RL}$) and the second clock signal (e.g., CLKB$_{RL}$). A phase of a waveform of the ring oscillator (e.g., four stage RO 140) is aligned, at step 770, with the first clock signal (e.g., CLK$_{RL}$) based on the realigned signal (e.g., current through realigned current cell array 261).

In one embodiment, an oscillator includes a resistor bank array, an operational amplifier, a first and second transistor, and a realignment circuit. The resistor bank array has a plurality of resistors configured to generate a first signal. The operational amplifier is coupled to a PLL circuit and is configured to compare a voltage of the PLL circuit with a voltage of the resistor bank array. The first transistor is coupled between the operational amplifier and a ring oscillator. The first transistor is configured to generate a second signal to control a frequency of the ring oscillator during a realignment state. The realignment circuit is coupled to the first transistor and the ring oscillator. The realignment circuit is configured to generate a realignment signal to align the ring oscillator with a first clock signal during the realignment state.

In another embodiment, a method of realigning a programmable regulator voltage ring oscillator includes programming a variable resistance of a resistor bank array based on one or more tuning words. An operational amplifier receives a voltage from a phase lock loop circuit. The resistor bank array generates a first signal based on a comparison between the voltage from the phase lock loop circuit and a voltage of the resistor bank array. The operation of a ring oscillator is controlled based on the first signal. A signal-to-differential circuit generates a first clock signal and a second clock signal. A realignment current cell array generates a realigned signal based on the first clock signal and the second clock signal. A phase of a waveform of the ring oscillator is aligned with the first clock signal based on the realigned signal.

In yet another embodiment, a system includes a PLL circuit, a clock tree, and a programmable regulator voltage controlled ring oscillator. The PLL circuit is configured to generate a first voltage. The clock tree is configured to generate a first clock signal. The programmable regulator voltage controlled ring oscillator includes a resistor bank array, an operational amplifier, a first transistor, and a realignment circuit. The resistor bank array includes a plurality of resistors configured to generate a first signal. The operational amplifier is coupled to the PLL circuit and is configured to compare the first voltage of the PLL circuit with a voltage of the resistor bank array. The first transistor is coupled between the operational amplifier and a ring oscillator. The first transistor is configured to generate a second signal to control a frequency of the ring oscillator during a realignment state. The realignment circuit is coupled to the first transistor and the ring oscillator. The realignment circuit is configured to generate a realignment signal to align the ring oscillator with a clock signal based on the first clock signal during the realignment state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
generating, by a regulator, a comparison signal based on a comparison between a voltage from a first circuit and a voltage of a programmable portion of the regulator, wherein the programmable portion comprises a resistor bank array;
controlling operation of a ring oscillator by a first signal that is based on the comparison signal and that is received by the ring oscillator; and
realigning a phase of a waveform of the ring oscillator with a first clock signal based on a realigned signal received by the ring oscillator.

2. The method of claim 1, wherein the first circuit is a phase lock loop circuit and the method further comprises:
generating the first signal based on the comparison signal, wherein the realigning comprises:
generating, by a signal-to-differential circuit of a realignment circuit, the first clock signal and a second clock signal; and
generating, by a realigned current cell array of the realignment circuit coupled between the ring oscillator and an output of the signal-to-differential circuit, the realigned signal based on the first clock signal and the second clock signal.

3. The method of claim 2, wherein generating the first clock signal and the second clock signal comprises:
receiving, by a programmable pulse generator, a third clock signal;
generating, by the programmable pulse generator, a first realignment signal and a second realignment signal as differential signals based on the third clock signal;
generating, by the signal-to-differential circuit, the first clock signal and the second clock signal; and
operating a first transmission gate with the first clock signal and a second transmission gate with the second clock signal, wherein the realigned signal is generated based on the operation of the first transmission gate.

4. The method of claim 3, wherein the first clock signal enables the first transmission gate and the second clock signal disables the second transmission gate and the first transmission gate provides the realigned signal to the ring oscillator which in turn causes a voltage of the first transmission gate to go high and realign the phase of the waveform of the ring oscillator with the first clock signal.

5. The method of claim 2, wherein the realigned signal is one-fourth of a current generated by the resistor bank array.

6. The method of claim 2, wherein the resistor bank array comprises at least sixteen resistors coupled together in parallel.

7. The method of claim 3, wherein the third clock signal has a waveform with a narrow pulse width.

8. A device comprising:
a regulator, configured to generate a comparison signal based on a comparison between a voltage from a first circuit and a voltage of a programmable portion of the regulator, wherein the programmable portion comprises a resistor bank array;
a ring oscillator; and
a first transistor coupled to the regulator and the ring oscillator and configured to generate a first signal that is based on the comparison signal and received by the ring oscillator to control a frequency of the ring oscillator, wherein the ring oscillator is further configured to receive a realigned signal to align the ring oscillator with a first clock signal.

9. The device of claim 8, further comprising a realignment circuit including:
a realigned current cell array configured to generate the realigned signal based on the first signal;
a first transmission gate coupled to the realigned current cell array;
a second transmission gate coupled to the realigned current cell array;
a third transistor coupled to the second transmission gate configured to generate a standby current for switching of the first transmission gate and the second transmission gate;
a signal to differential circuit separately coupled to each of the first transmission gate and the second transmission gate, wherein the signal to differential circuit is configured to generate the first clock signal and a second clock signal; and
a programmable pulse generator configured to receive a third clock signal and generate a first realignment signal and a second realignment signal as differential signals based on the third clock signal.

10. The device of claim 9, wherein the first clock signal enables the first transmission gate and the second clock signal disables the second transmission gate and the first transmission gate provides the realigned signal to the ring oscillator which in turn causes a voltage of the first transmission gate to go high and realign a phase of a waveform of the ring oscillator with the first clock signal.

11. The device of claim 9, wherein the realigned current cell array comprises a plurality of transistors coupled in parallel.

12. The device of claim 8, wherein the realigned signal is one-fourth of the first signal.

13. The device of claim 8, wherein the resistor bank array includes a plurality of resistors coupled together in parallel.

14. The device of claim 13, further comprising a second transistor coupled between the first transistor and the resistor bank array.

15. The device of claim 14, wherein the first transistor is at least four times a size of the second transistor.

16. The device of claim 9, wherein the third clock signal has a waveform with a narrow pulse width.

17. A system comprising:
a regulator comprising a programmable portion and configured to generate a first signal based on a comparison between a voltage from a first circuit and a voltage of the programmable portion, wherein the programmable portion comprises a resistor bank array; and
a ring oscillator configured to receive a second signal based on the first signal, wherein the ring oscillator is further configured to receive a realigned signal to align the ring oscillator with a clock signal.

18. The system of claim 17, further comprising a realignment circuit including:
a realigned current cell array configured to generate the realigned signal based on the second signal;
a first transmission gate coupled to the realigned current cell array;
a second transmission gate coupled to the realigned current cell array;

a third transistor coupled to the second transmission gate configured to generate a standby current for switching of the first transmission gate and the second transmission gate;

a signal to differential circuit separately coupled to each of the first transmission gate and the second transmission gate, wherein the signal to differential circuit is configured to generate a first clock signal and a second clock signal; and a programmable pulse generator configured to receive a third clock signal and generate a first realignment signal and a second realignment signal as differential signals based on the third clock signal.

19. The system of claim 18, wherein the first clock signal enables the first transmission gate and the second clock signal disables the second transmission gate and the first transmission gate provides the realigned signal to the ring oscillator which in turn causes a voltage of the first transmission gate to go high and realign a phase of a waveform of the ring oscillator with the first clock signal.

20. The system of claim 18, wherein the third clock signal has a waveform with a narrow pulse width.

\* \* \* \* \*